United States Patent [19]

Arimatsu et al.

[11] Patent Number: 5,397,675

[45] Date of Patent: Mar. 14, 1995

[54] ALKALI DEVELOPABLE PHOTOSENSITIVE RESIN COMPOSITION CONTAINING OIL-SOLUBLE DIAZO RESIN

[75] Inventors: Seuji Arimatsu, Hirakata; Katsuji Konishi, Ibaragi; Yoshifumi Ichinose, Ikeda; Takakazu Hase, Nishinomiya, all of Japan

[73] Assignee: Nippon Paint Co., Ltd., Osaka, Japan

[21] Appl. No.: 99,452

[22] Filed: Jul. 30, 1993

[30] Foreign Application Priority Data

Jul. 31, 1992 [JP] Japan ................ 4-204933

[51] Int. Cl.$^6$ ............................ G03F 7/021
[52] U.S. Cl. .................... 430/175; 430/176; 430/281; 430/282; 430/283; 430/285; 430/286; 430/287; 430/288
[58] Field of Search ............ 430/175, 176, 281, 282, 430/283, 284, 285, 286, 287, 288

[56] References Cited

U.S. PATENT DOCUMENTS

| | | | |
|---|---|---|---|
| 4,916,046 | 4/1990 | Doessel | 430/175 |
| 5,229,244 | 7/1993 | Hertler et al. | 430/176 |

FOREIGN PATENT DOCUMENTS 0386780 12/1990 European Pat. Off. .

*Primary Examiner*—Charles L. Bowers, Jr.
*Assistant Examiner*—Christopher G. Young
*Attorney, Agent, or Firm*—Wenderoth, Lind & Ponack

[57] ABSTRACT

The present invention provides a photosensitive resin composition for lithographic printing, which is developable with an alkali developer and exhibits excellent resolusion and excellent print durability. The photosensitive resin composition comprises (a) an alkali-swellable or alkali-soluble binder resin and (b) an oil-soluble diazo resin, wherein the binder resin has an acid value of 5 to 150 and has in molecules a group represented by

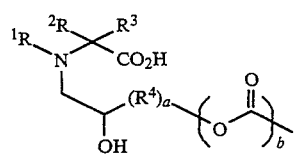

[1]

wherein $R^1$ represents a phenyl group which may have a substitution, $R^2$ and $R^3$, the same or different, represents a hydrogen atom or an alkyl group having 1 to 4 carbon atoms, $R^4$ represents an alkylene group of which a backbone may be interrupted with an oxygen atom, a cycloalkylene group or a combination thereof, and may have thereon an alkyl group, a hydroxyl group, an oxo (=O) group or a combination thereof, and a and b independently shows 0 or 1.

11 Claims, 1 Drawing Sheet

ALKALI DEVELOPABLE PHOTOSENSITIVE RESIN COMPOSITION CONTAINING OIL-SOLUBLE DIAZO RESIN

FIELD OF THE INVENTION

The present invention relates to a photosensitive resin composition. More particularly, it relates to an alkalidevelopable photosensitive resin composition which is suitable for lithographic printing.

BACKGROUND OF THE INVENTION

Lithographic printing is a printing process wherein a printing plate of which a portion of receiving ink, i.e. imaging portion, is composed of a hydrophobic resin composition layer having several micron thickness and a portion of receiving water, i.e. non-imaging portion, is composed of an exposed aluminum support of which surface is made hydrophilic by hydrophilic treatment, is employed and transferred onto a subjection to be printed. The photosensitive resin layer which constitutes the imaging portion is required to have lipophilic nature, print durability, chemical resistance, adhesion to a support, developability, high resolusion, coatability, storage stability and the like. Recently, in view of environmental problem or safety, it also has been desired to use an aqueous alkali developer in the step of forming printing plates, instead of organic solvent based developer.

Oil soluble diazo resin having diazonium salt has been used for the photosensitive resin layer of the lithographic printing, because it has good photosensitivity, lipophilic nature and storage stability. The diazo resin, however, has poor water solubility. In order to use an alkali developer, it is proposed to mix with an alkali-soluble binder resin (for example, Japanese Kokoku Publication 34929/1980 and 43890/1982). The alkali-soluble binder resin has high hydrophilic nature by increasing acid value, but this adversely reduces lipophilic nature after developing, resulting in poor resolusion.

Japanese Kokai Publication 32255/1989 proposes a process for reducing hydrophilic nature of the exposed portion by using a photosensitive resin having a carboxyl group which is decarboxylated upon exposure to light. The photosensitive resin, however, has poor photosensitivity and poor crosslinkability. Accordingly, the resulting lithographic printing plate has poor resolution and poor print durability.

SUMMARY OF THE INVENTION

The present invention provides a photosensitive resin composition for lithographic printing, which is developable with an alkali developer and exhibits excellent resolusion and excellent print durability. The photosensitive resin composition comprises (a) an alkali-swellable or alkali-soluble binder resin and (b) an oil-soluble diazo resin, wherein the binder resin has an acid value of 5 to 150 and has in molecules a group represented by

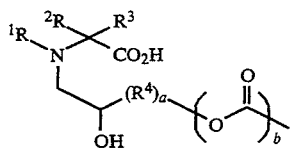

[1]

wherein $R^1$ represents a phenyl group which may have a substitution, $R^2$ and $R^3$, the same or different, represents a hydrogen atom or an alkyl group having 1 to 4 carbon atoms, $R^4$ represents an alkylene group of which a backbone may be interrupted with an oxygen atom, a cycloalkylene group or a combination thereof, and may have thereon an alkyl group, a hydroxyl group, an oxo (=O) group or a combination thereof, and a and b independently shows 0 or 1. The groups

DETAILED DESCRIPTION OF THE INVENTION

The binder resin (a) used in the present invention may be prepared by copolymerizing a monomer (m1) represented by

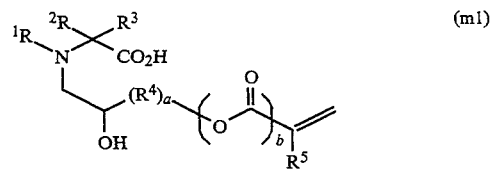

(m1)

wherein said $R^5$ represents a hydrogen atom or a methyl group, and $R^1$ to $R^4$, a and b are the same as mentioned above, with a copolymerizable monomer (m2) other than the monomer (m1). The monomer (m1) may be prepared by reacting a polymerizable compound having an epoxy group (e.g. a compound having both an epoxy group at a terminal and a vinyl group, an acryloyl group or a methacryloyl group at the other terminal) with an N-aryl-α-amino acid.

Typical examples of the N-aryl-α-amino acids are N-phenylglycine, N-phenylalanine, N-phenylvaline, N-phenylleucine, N-(p-tolyl)glycine, N-(p-chlorophenyl)glycine, N-(p-bromophenyl)glycine, N-(p-iodophenyl)glycine and the like. Preferred are N-phenylglycine, N-(p-chlorophenyl)glycine, N-(p-bromophenyl)glycine and N-(p-iodophenyl)glycine.

The polymerizable compound having an epoxy group includes

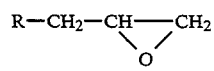

wherein R represents an acryloyloxy group ($CH_2$=CH—CO—O—) or a methacryloyloxy group ($CH_2$=C($CH_3$)—CO—O—)

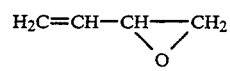

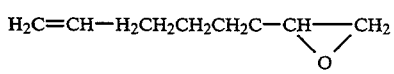

These compounds are commercially available. The polymerizable compound having an epoxy group may also be prepared as described in following (i) to (iii):

(i) A compound prepared by ring-opening one of epoxy groups of a diglycidyl ether of diol (e.g. polyethyleneglycol diglycidyl ether, polypropyleneglycol diglycidyl ether, neopentylglycol diglycidyl ether, 1,6-hexanediol diglycidyl ether and glycerol diglycidyl ether) with (meth)acrylic acid; for example

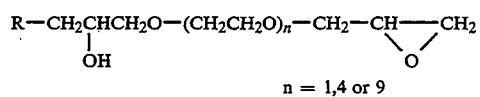

n = 1, 4 or 9

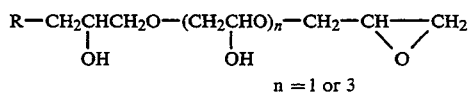

n = 1 or 3

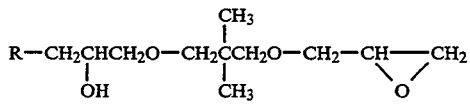

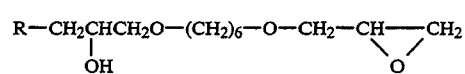

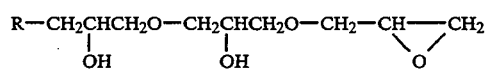

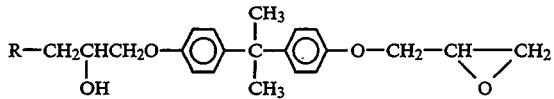

(wherein R is the same as mentioned above.)

(ii) A compound obtained by reacting an epihalohydrin with a monomer having a hydroxyl group (e.g. hydroxyethyl (meth)acrylate, hydroxypropyl (meth)acrylate, polyethyleneglycol mono(meth)acrylate and polypropyleneglycol mono(meth)acrylate); for example,

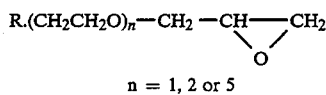

n = 1, 2 or 5

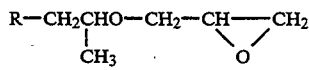

(R is the same as mentioned above.)

(iii) A compound obtained by modifying a monomer having a hydroxyl group with ε-caprolactone, followed by reacting an epihalohydrin; for example

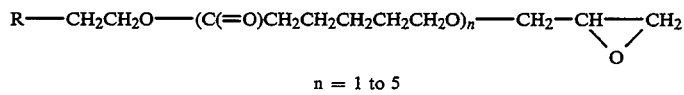

n = 1 to 5

(R is the same as mentioned above.)

The copolymerizable compound which is reacted with the monomer (m1) includes the following (I) to (XIV):

(I) a carboxyl group-containing monomer, for example acrylic acid, methacrylic acid, crotonic acid, itaconic acid, maleic acid, fumaric acid and the like;

(II) a hydroxyl group-containing monomer, for example 2-hydroxyethyl (meth)acrylate, hydroxypropyl (meth)acrylate, hydroxybutyl (meth)acrylate, allyl alcohol, methallyl alcohol and a compound obtained by adding an ethylenic allyl unsaturated double bond to glycoside (e.g. glycosylethyl (meth)acrylate);

(III) a nitrogen-containing alkyl (meth)acrylate, for example dimethylaminoethyl (meth)acrylate;

(IV) a polymeriable amide, for example (meth)acrylamide, N-methylol acrylamide and diacetone acrylamide;

(V) a polymerizable nitrile, for example (meth)acrylonitrile;

(VI) an alkyl (meth)acrylate, for example methyl (meth)acrylate, ethyl (meth)acrylate, n-butyl (meth)acrylate, isobutyl (meth)acrylate, isopropyl (meth)acrylate and 2-ethylhexyl (meth)acrylate;

(VII) an isocyanate group-containing monomer, for example (meth)acryl isocyanate and isocyanatoethyl (meth)acrylate;

(VIII) a glycidyl (meth)acrylate;

(IX) a polymerizable aromatic compound, for example styrene, α-methylstyrene, vinyltoluene and t-butylstyrene;

(X) an α-olefin, for example ethylene and propylene;

(XI) a vinyl compound, for example vinyl acetate and vinyl propionate;

(XII) a diene compound, for example butadiene and isoprene;

(XIII) a compound obtained by reacting the above mentioned monomer with a compound having a functional group reactive therewith, for example a reaction product of the hydroxyl group-containing monomer (II) with an isocyanate compound and a reaction product of the carboxyl group-containing monomer with a glycidyl group-containing compound; and (XIV) an amphoteric ion group-containing monomer, for example N,N-dimethyl-N-methacrylamidepropyl-N-(3-sulfopropyl)ammonium betaine and N,N-dimethyl-N-methacryloxyethyl-N-(3-sulfopropyl)ammonium betaine.

A polymerization method of the monomer (m1) and the above mentioned copolymerizable monomer (m2) is not limited, for example it may be conducted by solution polymerization at 50° to 180° C. for 0.5 to 30 hours.

The polymerization reaction may be initiated by a polymerization initiator which is known to the art. Typical examples of the initiators are peroxides, such as cumene hydroxyperoxide, di-butyl peroxide, benzoyl peroxide and t-butyl peracetate; azo compounds, such as azobisisobutylonitrile; redox compounds, such as persulfate and hydrogen peroxide; and the like. It may be conducted in a solvent (e.g. isopropanol, methoxypropanol, butanol, xylol, tolol and isophorone). The polymerization reaction may be conducted in the presence of a heat polymerization inhibitor (e.g. hydroquinone and methoquinone).

An amount of the monomer (m1) is not limited, but is generally within the range of 1 to 300 parts by weight, based on 100 parts by weight of the monomer (m2), and an amount of the polymerization initiator is generally within the range of 0.01 to 5 parts by weight, based on 100 parts by weight of the monomer (m2).

The binder (a) may be prepared in a different way, for example polymerizing a monomer (m3) represented by

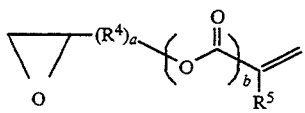 (m3)

wherein $R^4$, $R^5$, a and b are the same as mentioned above,
with the monomer (m2) to obtain a polymer which is then reacted with a salt of N-aryl-α-amino acid, represented by

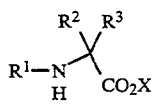

wherein X is a monovalent metal (e.g. Na and K), $R^1$, $R^2$ and $R^3$ are the same as mentioned above.
The resulting polymer is reacted with strong acid to convert to the acid polymer.

The binder resin (a) of the present invention shall control acid value to 5 to 150, preferably 20 to 100. If the acid value is less than 5, developability is poor. If it is more than 150, highlight portions or thin lines remain insufficiently because alkali solubility is too high. Film strength is also poor. The acid value can be adjusted by selecting monomers and changing amounts thereof.

In addition to the binder resin (a), a binder resin which is known to the art may be employed. Typical examples of the art-known binder resins are acryl resin, epoxy resin, styrene resin, alkyd resin, polyester resin, phenol resin, polyether resin, amino resin, polyurethane resin, vinyl chloride resin, fluorine resin, silicone resin and polybutadiene resin. The binder resin can be alkali soluble or alkali insoluble. The binder resin may be combined with the binder resin (a) in an amount of 0 to 100 parts by weight, based on the 100 parts by weight of the binder resin (a). Amounts of more than 100 parts by weight do not exhibit the technical effects of the binder resin (a).

The photosensitive resin composition of the present invention contains an oil-soluble diazo resin. The diazo resin may be a condensate of an aromatic diazonium salt with a compound having an active carbonyl group (e.g. formaldehyde). Preferred is a hexafluorophosphate, tetrafluoroborate or tetrafluorophosphate of a condensate of p-diazodiphenylamine with formaldehyde or acetoaldehyde. A sulfonate, a phosphinate, a hydroxyl group-containing compound salt or an organic carboxylic salt of the condensate of p-diazophenylamine with formaldehyde is also preferred (see U.S. Pat. No. 3,300,309). The sulfate includes p-toluenesulfonate, dodecylbenzenesulfonate and 2-methoxy-4-hydroxy-5-benzoylbenzenesulfonate. The phosphinate includes benzenphosphinate and the hydroxyl group-containing compound salt includes 2,4-dihydroxybenzophenon salt. The diazo resin can also be one which is prepared by condensing 3-methoxy-4-diazodiphenylamine with 4,4-bis-methoxy-methyl-diphenyl ether, followed by forming methylenesulfonate, as described in Japanese Kokai Publication 27141/1983 (corresponding CA 1172492/1984).

The oil-soluble diazo resin may be contained in the composition in an amount of 2 to 20 parts by weight, preferably 5 to 12 parts by weight, based on 100 parts by weight of the total amount of the binder resin (a) and optional the art-known binder resin. Amounts of less than 2 parts by weight deteriorate print durability and chemical resistance. Amounts of more than 20 parts by weight reduce sensitivity.

The alkali developable photosensitive resin composition of the present invention may contain a compound having an ethylenic unsaturated double bond, a photopolymerization initiator, a sensitizing dye and an additive, if necessary.

The compound having an ethylenic unsaturated double bond can be formulated in order to enhance print durability. The compound is known to the art, but including styrene, vinyl toluene, chlorostyrene, t-butylstyrene, α-methylstyrene, divinyl benzene, (meth)acrylic acid, methyl methacrylate, ethyl (meth)acrylate, n-propyl (meth)acrylate, isopropyl (meth)acrylate, n-butyl (meth)acrylate, isobutyl (meth)acrylate, sec-butyl (meth)acrylate, t-butyl (meth)acrylate, 2-ethylhexyl (meth)acrylate, n-nonyl (meth)acrylate, n-decyl (meth)acrylate, lauryl (meth)acrylate, n-tridecyl (meth)acrylate, stearyl (meth)acrylate, ethyleneglycol mono(meth)acrylate, propyleneglycol mono(meth)acrylate, diethyleneglycol mono(meth)acrylate, dipropyleneglycol mono(meth)acrylate, polyethyleneglycol (molecular weight=200 to 1,000) mono(meth)acrylate, polypropyleneglycol (molecular weight=200 to 1,000) mono(meth)acrylate, polyethyleneglycol (molecular weight=200 to 1,000) monomethyl ether mono(meth)acrylate, polypropyleneglycol (molecular weight=200 to 1,000) monomethyl ether mono(meth)acrylate, polyethyleneglycol (molecular weight=200 to 1,000) monoethyl ether mono(meth)acrylate, polypropyleneglycol (molecular weight=200 to 1,000)monoethyl ether mono(meth)acrylate, n-butoxyethyl (meth)acrylate, phenoxyethyl (meth)acrylate, 2-phenoxypropyl (meth)acrylate, cyclohexyl (meth)acrylate, tetrafurfuryl (meth)acrylate, glycidyl (meth)acrylate, allyl (meth)acrylate, benzyl (meth)acrylate, tribromophenyl (meth)acrylate, 2,3-dichloropropyl (meth)acrylate, 3-chloro-2-hydroxypropyl (meth)acrylate, N,N-diethylaminoethyl (meth)acrylate, N,N-dimethylamino (meth)acrylate, N-t-butylaminoethyl (meth)acrylate, acrylamide, N,N-dimethyl acrylamide, N,N-diethyl acrylamide, ethyleneglycol di(meth)acrylate, propyleneglycol di(meth)acrylate,1,3-propanediol di(meth)acrylate, 1,4-butanediol di(meth)acrylate, neopentylglycol di(meth)acrylate, 1,6-hexanediol di(meth)acrylate, polyethyleneglycol di(meth)acrylate, polypropyleneglycol di(meth)acrylate, glycerol di(meth)acrylate, glycerol tri(meth)acrylate, trimethylolpropane tri(meth)acrylate, trimethylolethane tri(meth)acrylate, ethylene bisacrylamide, diallyl phthalate, triallyl cyanulate, diethyl fumarate, dibutyl fumarate, vinyl acetate and the like. The compound can also be the polymerizable monomer (m2). The compound having an ethylenic allyl unsaturated double bond may be present in the composition in an amount of 0 to 200 parts by weight, preferably 0 to 100 parts by weight, based on 100 parts by weight of the total weight of the binder resin. Amounts of more than 200 parts by weight make the photosensitive layer tacky and may spoil a negative film, thus requiring cautious treatment.

The photopolymerization initiator can be formulated in the composition of the present invention in order to enhance photosensitivity. Typical examples of the initiators are benzoin, a benzoin alkyl ether (e.g. benzoin methyl ether, benzoin isopropyl ether and benzoin t-butyl ether), benzophenone, benzyl, benzyl dimethyl ketal, an anthraquinone derivative, an acridine derivative, a thioxanthone derivative, a triazine derivative, a titanocene derivative and the like. Preferred are an anthraquinone derivative, acridine derivative, thioxanthone derivative, triazine derivative and titanocene derivative. An amount of the initiator is within the range of 0 to 20 parts by weight, preferably 0 to 10 parts by weight, based on 100 parts by weight of the total weight of the binder resin. Amounts of more than 20 parts by weight provide photosensitivity too high and deteriorate storage stability.

The sensitizing dye is added to the composition in order to control photosensitive wave length area of the photosensitive resin composition. Typical examples of the sensitizing dyes are a coumarin dye, such as 3,3'-carbonylbiscoumarin as described in Japanese Kokai Publication 180946/1988; a xanthene or thioxanthene dye as described in Japanese Kokai Publication 126302/1989; a cyanine dye as described in Japanese Kokai Publication 287105/1989; a merocyanine dye as described in Japanese Kokai Publication 278909/1988; a dye other than the above dye, such as Rose Bengale and eosin; and the like. The sensitizing dye may be added to the composition in an amount of 0 to 25 parts by weight, preferably 0 to 20 parts by weight, based on 100 parts by weight of the total weight of the binder resin. Amounts of more than 25 parts by weight provide photosensitivity too high and deteriorate storage stability.

A coloring dye may be formulated into the composition for making it easy to examine the resulting printing plate and to treat the printing plate. Typical examples of the coloring dyes are basic dyes, such as Victoria Glue BOH, Victoria Blue BH, Methyl Violet, Aizen Malachite Green which are available from Hodogaya Chemical Co., Ltd.), Patent Pure Blue VX, Rhodamine B and Methylene Blue which are available from Sumitomo Chemical Co., Ltd.; oil-soluble dyes, such as Sudan Blue II and Victoria Blue f4R which are available from BASF, Oil Blue #603, Oil Blue BOS and Oil Blue IIN (Orient Chemical Industries, Inc.); and the like.

The photosensitive resin composition of the present invention may contain additives, such as solvent, matting agent, organic or inorganic filler, pigment, photodecomposable acid generator, surfactant, defoaming agent and the like. Microgels having a particle size of 0.01 to 5μ, of which inside is gelled, is preferred as organic filler. These microgels are disclosed in Japanese Pat. No. Application Ser. No. 36029/1991 (corresponding U.S. patent application Ser. No. 07/843,951). Preferred microgels are those having a particle size of 0.01 to 2μ, prepared by emulsion-polymerization using a polymer emulsifier having a solubility parameter (Sp) of 9 to 16.

The photosensitive resin composition of the present invention can be prepared by conventional methods, for example by mechanically mixing the above mentioned components in a dark place.

An offset printing plate can be prepared from the photosensitive resin composition by conventional methods, for example by coating the photosensitive resin composition on a suitable substrate. Typical examples of the substrates are metal plate, such as aluminum (including aluminum alloy), zinc and copper; plastic film, such as cellulose diacetate, cellulose triacetate, cellulose propionate, cellulose acetate, methylcellulose acetate, ethylcellulose acetate, cellulose nitrate, polyethylene terephthalate, polyethylene, polystyrene, polypropylene, polycarbonate and polyvinyl acetal; plastic film, as listed above, on which metal is laminated or vapor-deposited; and the like. Among them, aluminum plate is preferred because of dimensional stability and relatively light and cheap. A composite sheet composed of a polyethylene terephthalate film and a aluminum sheet adhering thereto, as described in Japanese Kokoku Publication 18327/1973, is also preferred. When the support has metal surface, especially aluminum surface, it is preferred that the surface is surface treated to make hydrophilic by conventional methods.

Coating method is not limited, for example using a bar coater. After coating, the coated substrate is generally dried at 40° to 80° C. for about 1 to 10 minutes. A coating amount after drying may be 0.5 to 2.5 g/m$^2$. If necessary, an over coat layer (e.g. polyvinyl alcohol layer or hydroxypropyl methylcellulose layer which is soluble with an alkali developer) may be formed on the photosensitive resin layer.

Subsequently, the resulting resin plate is contacted with a negative film, and exposed and developed to obtain an off-set printing plate. Exposure to light may be conducted using a light source, such as a carbon arc lamp, a mercury lamp, a xenon lamp, a metal halide lamp, a strobe light, a ultraviolet light source, a visible light source and the like. Development is generally conducted by an alkali developer which contains an alkali compound. Typical examples of the alkali compounds are inorganic compounds, such as sodium silicate, potassium silicate, potassium hydroxide, sodium hydroxide, lithium hydroxide, sodium triphosphate, sodium pyrophosphate, ammonium triphosphate, ammonium pyrophosphate, sodium metasilicate, sodium bicarbonate and ammonia; and organic compounds, such as monomethylamine, dimethylamine, trimethylamine, monoethylamine, diethylamine, triethylamine, monoisopropylamine, diisopropylamine, n-butylamine, monoethanolamine, diethanolamine, triethanolamine, monoisopropanolamine, diisopropanolamine, triisopropanolamine, ethyleneimine, diethyleneamine and pyridine. A solvent for the alkali compound is generally water, especially deionized water. A water-miscible organic solvent (e.g. benzyl alcohol, phenyl Cellosolve, ethyl Cellosolve) may be added to water. A content of the alkali compound is not limited, and can be varied widely.

The photosensitive resin composition of the present invention has excellent resolusion, and exhibits good oil affinity, print durability and chemical resistance in imaging portion. It is believed that the substituent of the binder resin (a) brings about the good characteristics. The OH group of the substituent of the binder resin (a) is reacted with the diazo resin upon exposing to form crosslinking. When the substituent absorbs light, the carboxyl group therein is decarboxylated to turn water-insoluble. Also, the decarboxylation will produce active radicals which additionally proceeds crosslinking reaction in exposed portion. As the result, the difference of alkali solubility between the light-exposed imaging portion and the non-exposed non-imaging portion is larger, and higher resolusion is obtained, thus increase photosensitivity, oil-affinity, print durability and chemical resistance of the imaging portion.

If the compound having an ethylenic unsaturated double bond is formulated into the composition, the compound will radically polymerize to promote crosslinking reaction of the photosensitive resin composition. Thus, the oil-affinity, print durability and chemical resistance of the imaging portion would increase. Also, the use of the photopolymerization initiator and sensitizing dye promotes radical generation and sensitizes by wave length, thus attaining high sensitivity.

EXAMPLES

Figure 1:
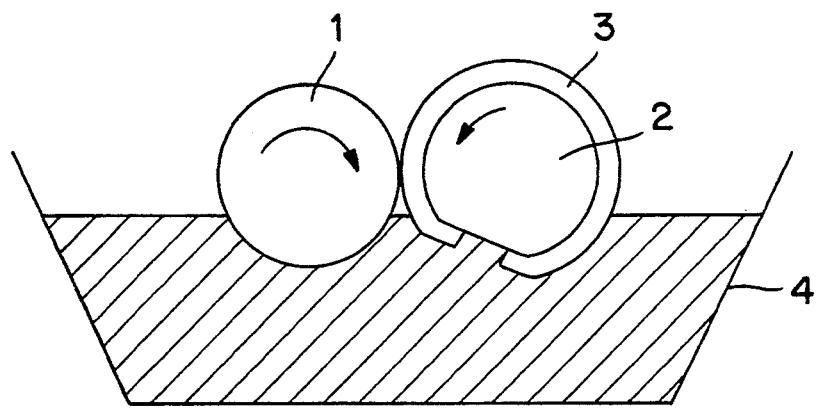
FIG. 1 schematically shows an apparatus for determing print durability in Examples and Comparative Examples.

The present invention is illustrated by the following examples which, however, are not to be construed as limiting the scope of the invention. The term "part(s)" in Examples is based on weight, unless otherwise instructed.

Synthetic Examples 1-3 will explain synthesis of a polymerizable monomer.

Synthetic Example 1

A sodium hydroxide aqueous solution containing 4.8 parts of sodium hydroxide and 180 parts of water was added slowly to 160 parts of a methanol solution of 18.0 parts of N-phenylglycine, and mixed for 10 minutes. To the content, 0.12 parts of methoquinone and 23.7 parts of glycidyl methacrylate were added and mixed at 50° C. for 3 hours. The reaction mixture was distilled to remove methanol and poured into methylene chloride, followed by extracting two time. Aqueous hydrochloric acid was added and made acidic to precipitate solid material. The precipitated material was filtered and dried to obtain white crystal. The crystal was recrystallized with methyl Cellosolve to obtain white crystal. It was confirmed by $^1$H-NMR and IR.

Synthetic Example 2

A reaction product was prepared as generally described in Synthetic Example 2 with the exception that the compound represented by

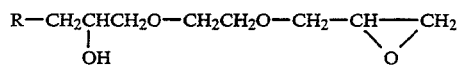

wherein R is a methacryloyloxy $CH_2=CH(CH_3—CO—O—)$ group,
was employed instead of glycidyl methacrylate.

Synthetic Example 3

A reaction product was prepared as generally described in Synthetic Example 2 with the exception that the compound represented by

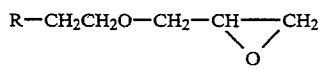

wherein R is a methacryloyloxy $CH_2=CH(CH_3—CO—O—)$ group,
was employed instead of glycidyl methacrylate.

PREPARATION EXAMPLES

The following Preparation Examples show preparation of binder resins.

Preparation Example 1

A reaction vessel, equipped with a stirrer, a nitrogen gas introducing tube, a thermostat, a dropping funnel and a condenser, was charged with 50 parts of methyl Cellosolve and heated to 90° C. To the content, a mixture of the ingredients shown in Table 1, 1.9 parts of azobisisobutylonitrile (AIBN) and 100 parts of methyl Cellosolve was added dropwise over 2 hours. After completion of adding, 50 parts of methyl Cellosolve was added and mixed at 90° C. for 30 minutes. Thereafter, a mixture of AIBN 0.5 parts and 50 parts of methyl Cellosolve was added dropwise for one hour, and mixing continued for another 30 minutes. The reaction mixture was poured into deionized water and the precipitate was filtered to separate. The precipitate was rinsed with deionized water and vacuum-dried to obtain an acrylic binder.

Table 1 shows the ingredients of the binder resins and their acid value and OH value.

TABLE 1

| | Preparation Example Number | | | | | | | | |
|---|---|---|---|---|---|---|---|---|---|
| | 1 | 2 | 3 | 4 | 5 | 6 | 7 | 8 | 9 |
| Ingredients (Parts) | | | | | | | | | |
| 2-Hydroxyethyl methacrylate | 25 | — | 10 | — | — | — | | 30.3 | 25 |
| Acrylonitrile | 20 | 20 | 20 | 10 | — | — | — | 20 | 20 |
| Methyl methacrylate | 25 | 23.7 | 56.4 | 67 | 38 | 34 | — | 28.1 | 38.5 |
| Isobutyl methacrylate | 17 | — | — | — | 39.5 | 34.4 | 37 | 17 | — |
| Monomer of Synthetic Example 1 | 11.9 | 56.3 | 13.6 | 20 | 22.5 | — | 37.1 | — | — |
| Monomer of Synthetic Example 2 | — | — | — | — | — | 31.6 | — | — | — |
| Monomer of Synthetic Example 3 | — | — | — | — | — | — | —25.9 | — | — |
| Methacrylic acid | 1.1 | — | — | 3.0 | — | — | — | 4.6 | 16.5 |
| Acid value | 30 | 107.8 | 26.0 | 57.9 | 43.1 | 43.1 | 43.1 | 30 | 107.8 |
| Hydroxyl value | 130.8 | 107.8 | 69.2 | 38.3 | 43.1 | 86.2 | 43.1 | 130.8 | 107.8 |

Example 1

On an aluminum plate, which had been sanded, alkali-etched, electrochemically rubbed, anodic-oxidated and made hydrophilic with sodium silicate, a photosensitive liquid having the following ingredients was coated with a bar coater. It was then dried at 80° C. for 4 minutes and a dried coating amount was 2 g/m².

| Ingredients | Parts |
|---|---|
| Binder resin of Preparation Ex. 1 | 9 |
| Victoria Pure Blue BOH | 0.25 |
| Diazo resin*¹ | 1 |
| Polyacrylic acid*² | 0.2 |
| Methyl Cellosolve | 50 |

-continued

| Ingredients | Parts |
|---|---|
| Dimethyl formamide | 39.55 |

*[1] Hexafluorophosphate of a condensate of p-diazodiphenylamine and paraformaldehyde.
*[2] Available from Nihon Junyaku K.K. as AC-10P.

The resulting photosensitive plate was exposed at a distance of 1.2 m for one and half minutes though a negative film, using a Vacuum Printer HVP-22H available from Sakaguchi Seiwa Kogyo K.K. (Metal Halide Lamp of 3 KW of Eyegraphics K.K.). The resulting plate was developed by a developer (two-fold dilue solution of DN-3C available from Fuji Photo Film K.K.) to obtain a distinct image which was faithful to the negative film. The photosensitivity of the resin plate and the resolusion and print durability of the printing plate are shown in Table 2.

Table 2 also shows the same characteristics of the following Examples and Comparative Examples.

Comparative Example 1

A printing plate was prepared as generally described in Example 1, with the exception that the diazo resin was not employed. The printing plate had poor print durability.

Comparative Example 2

A printing plate was prepared as generally described in Example 1, with the exception that the binder resin of Preparation Example 8 was employed instead of the binder resin of Preparation Example 1. The resolusion of the printing plate was the same as Example 1, but the print durability was poor.

Example 2

A photosensitive resin layer was formed as generally described in Example 1, with the exception that the following ingredients were employed.

| Ingredients | Parts |
|---|---|
| Binder resin of Preparation Ex. 1 | 6.5 |
| Victoria Pure Blue BOH | 0.25 |
| Diazo resin*[1] | 0.7 |
| Defunctional monomer*[3] | 0.9 |
| Trimethylolpropane triacrylate | 1.9 |
| Polyacrylic acid*[2] | 0.2 |
| Methyl Cellosolve | 50 |
| Dimethyl formamide | 39.55 |

*[3] BPE-500 available from Shin-nakamura Kagaku K.K.

On the photosensitive resin layer, a 5% polyvinyl alcohol aqueous solution was coated so that the final coating amount was 2 g/m$^2$, and dried at 80° C. for 4 minutes to form an overcoat layer. The resulting plate was exposed and developed as generally described in Example 1 to obtain a distinct image which was faithful to the negative film.

Example 3

A photosensitive resin layer was formed as generally described in Example 1, with the exception that the following ingredients were employed.

| Ingredients | Parts |
|---|---|
| Binder resin of Preparation Ex. 1 | 6.5 |
| Victoria Pure Blue BOH | 0.25 |

-continued

| Ingredients | Parts |
|---|---|
| Diazo resin*[1] | 1.0 |
| Photopolymerization initiator*[4] | 0.5 |
| Polyacrylic acid*[2] | 0.2 |
| Methyl Cellosolve | 50 |
| Dimethyl formamide | 39.55 |

*[4] t-Butylanthraquinone

The resulting plate was exposed and developed as generally described in Example 1 to obtain a distinct image which was faithful to the negative film.

Comparative Example 3

A printing plate was prepared as generally described in Example 3, with the exception that the diazo resin was not employed. The printing plate had poor resolusion. The printing plate also had poor print durability in comparison with the plate of Example 3.

Example 4

A photosensitive resin layer was formed as generally described in Example 1, with the exception that the following ingredients were employed.

| Ingredients | Parts |
|---|---|
| Binder resin of Preparation Ex. 1 | 6.5 |
| Victoria Pure Blue BOH | 0.25 |
| Diazo resin*[1] | 1.0 |
| Sensitizing dye*[5] | 0.5 |
| Polyacrylic acid*[2] | 0.2 |
| Methyl Cellosolve | 50 |
| Dimethyl formamide | 39.55 |

*[5] 3,3'-Carbonylbis(7-diethylaminocoumarine)

The resulting plate was exposed and developed as generally described in Example 1 to obtain a distinct image which was faithful to the negative film.

Example 5

A photosensitive resin layer was formed as generally described in Example 1, with the exception that the following ingredients were employed.

| Ingredients | Parts |
|---|---|
| Binder resin of Preparation Ex. 2 | 6.5 |
| Victoria Pure Blue BOH | 0.25 |
| Diazo resin*[1] | 0.8 |
| Sensitizing dye*[5] | 1.6 |
| Polyacrylic acid*[2] | 0.2 |
| Methyl Cellosolve | 40 |
| Dimethyl formamide | 39.55 |

The resulting photosensitive plate was exposed at a distance of 1.2 m for one and half minutes though a negative film, using a Vacuum Printer HVP-22H available from Sakaguchi Seiwa Kogyo K.K. (Metal Halide Lamp of 3 KW of Eyegraphics K.K.). The resulting plate was developed by a developer (two-fold dilute solution of DN-3C available from Fuji Photo Film K.K.), and then a gum solution (two-fold dilution of FN-2 available from Fuji Photo Film K.K.) was coated thereon to obtain a printing plate.

The printing plate was employed and printed with a off-set ultraviolet curable ink containing 5% by weight of isopropanol alcohol (available from Toyo Ink MFG Co. Ltd. More than 100,000 sheet prints have no spoil and no thin spot.

Comparative Example 4

A printing plate was prepared as generally described in Example 5, with the exception that the binder resin of Preparation Example 9 was employed instead of the binder resin of Preparation Example 2. Upon developing, the thickness of the cured portion reduced and therefore it was impossible to print.

Example 6

A printing plate was prepared as generally described in Example 5, with the exception that the binder resin of Preparation Example 3 was employed instead of the binder resin of Preparation Example 2. A printing test was conducted as generally described in Example 5 and more than 100,000 sheets of print have no spoil and thin portion.

Example 7

A printing plate was prepared as generally described in Example 5, with the exception that the binder resin of Preparation Example 4 was employed instead of the binder resin of Preparation Example 2. A printing test was conducted as generally described in Example 5 and more than 100,000 sheets of print have no spoil and thin portion.

Example 8

A photosensitive resin layer was formed as generally described in Example 1, with the exception that the following ingredients were employed.

| Ingredients | Parts |
| --- | --- |
| Binder resin of Preparation Ex. 1 | 6.5 |
| Victoria Pure Blue BOH | 0.25 |
| Diazo resin*[1] | 1.0 |
| Defunctional monomer*[3] | 0.7 |
| Trimethylolpropane triacrylate | 1.6 |
| Photopolymerization initiator*[6] | 0.5 |
| Polyacrylic acid*[2] | 0.2 |
| Methyl Cellosolve | 50 |
| Dimethyl formamide | 39.55 |

*[6] Available from Ciba Geigy A.G. as Irugacure 907.

On the photosensitive resin layer, a 5% polyvinyl alcohol aqueous solution was coated so that the final coating amount was 2 g/m$^2$, and dried at 80° C. for 4 minutes to form an overcoat layer. The resulting plate was exposed and developed as generally described in Example 1 to obtain a distinct image which was faithful to the negative film. A printing test was conducted as generally described in Example 5 and more than 200,000 sheets of print have no spoil and thin portion.

Comparative Example 5

A printing plate was prepared as generally described in Example 8, with the exception that the diazo resin was not employed. The printing plate had poor resolusion. A printing test was conducted as generally described in Example 5 and only 50,000 sheets of print were obtained.

Example 9

A photosensitive resin layer was formed as generally described in Example 1, with the exception that the following ingredients were employed.

| Ingredients | Parts |
| --- | --- |
| Binder resin of Preparation Ex. 1 | 6.5 |
| Victoria Pure Blue BOH | 0.25 |
| Diazo resin*[1] | 0.7 |
| Difunctional monomer*[3] | 0.7 |
| Trimethylolpropane triacrylate | 1.6 |
| Sensitizing dye*[4] | 0.5 |
| Polyacrylic acid*[2] | 0.2 |
| Methyl Cellosolve | 50 |
| Dimethyl formamide | 39.55 |

On the photosensitive resin layer, a 5% polyvinyl alcohol aqueous solution was coated so that the final coating amount was 2 g/m$^2$, and dried at 80° C. for 4 minutes to form an overcoat layer. The resulting plate was exposed and developed as generally described in Example 1 to obtain a distinct image which was faithful to the negative film.

A printing test was conducted as generally described in Example 5 and more than 200,000 sheets of print have no spoil and thin portion.

Example 10

A photosensitive resin layer was formed as generally described in Example 1, with the exception that the following ingredients were employed.

| Ingredients | Parts |
| --- | --- |
| Binder resin of Preparation Ex. 2 | 9.2 |
| Victoria Pure Blue BOH | 0.25 |
| Diazo resin*[1] | 0.8 |
| Sensitizing dye*[4] | 1.6 |
| Trimethylolpropane triacrylate | 3.0 |
| Polymerization inhibitor | 0.06 |
| Polyacrylic acid*[2] | 0.2 |
| Methyl Cellosolve | 40 |
| Dimethyl formamide | 44.89 |

On the photosensitive resin layer, a 5% polyvinyl alcohol aqueous solution was coated so that the final coating amount was 2 g/m$^2$, and dried at 80° C. for 4 minutes to form an overcoat layer. The resulting plate was exposed and developed as generally described in Example 1 to obtain a distinct image which was faithful to the negative film.

A printing test was conducted as generally described in Example 5 and more than 150,000 sheets of print have no spoil and thin portion.

Example 11

A printing plate was prepared as generally described in Example 10, with the exception that the binder resin of Preparation Example 4 was employed instead of the binder resin of Preparation Example 2. A printing test was conducted as generally described in Example 10 and more than 150,000 sheets of print have no spoil and thin portion.

Example 12

A printing plate was prepared as generally described in Example 10, with the exception that the binder resin of Preparation Example 5 was employed instead of the binder resin of Preparation Example 2. A printing test was conducted as generally described in Example 10 and more than 150,000 sheets of print have no spoil and thin portion.

Example 13

A printing plate was prepared as generally described in Example 10, with the exception that the binder resin of Preparation Example 6 was employed instead of the binder resin of Preparation Example 2. A printing test was conducted as generally described in Example 10 and more than 200,000 sheets of print have no spoil and thin portion.

Example 14

A printing plate was prepared as generally described in Example 10, with the exception that the binder resin of Preparation Example 7 was employed instead of the binder resin of Preparation Example 2. A printing test was conducted as generally described in Example 10 and more than 200,000 sheets of print have no spoil and thin portion.

Example 15

A photosensitive resin layer was formed as generally described in Example 1, with the exception that the following ingredients were employed.

| Ingredients | Parts |
| --- | --- |
| Binder resin of Preparation Ex. 1 | 8.1 |
| Victoria Pure Blue BOH | 0.25 |
| Diazo resin*1 | 0.9 |
| Initiator (diethylthioxanthone) | 0.5 |
| Sensitizing dye*4 | 0.5 |
| Polyacrylic acid*2 | 0.2 |
| Methyl Cellosolve | 50 |
| Dimethyl formamide | 39.55 |

The resulting plate was exposed and developed as generally described in Example 5 to obtain a distinct image which was faithful to the negative film.

A printing test was conducted as generally described in Example 5 and more than 100,000 sheets of print have no spoil and thin portion.

Example 16

A photosensitive resin layer was formed as generally described in Example 1, with the exception that the following ingredients were employed.

| Ingredients | Parts |
| --- | --- |
| Binder resin of Preparation Ex. 1 | 6.0 |
| Victoria Pure Blue BOH | 0.25 |
| Diazo resin*1 | 0.7 |
| Defunctional monomer*5 | 0.7 |
| Initiator (diethylthioxanthone) | 0.5 |
| Sensitizing dye*4 | 0.5 |
| Polyacrylic acid*2 | 0.2 |
| Methyl Cellosolve | 50 |
| Dimethyl formamide | 39.55 |

On the photosensitive resin layer, a 5% polyvinyl alcohol aqueous solution was coated so that the final coating amount was 2 g/m$^2$, and dried at 80° C. for 4 minutes to form an overcoat layer. The resulting plate was exposed and developed to obtain a distinct image which was faithful to the negative film, and then a gum solution (two-fold dilute solution of FNN-2 available from Fuji Photo Film K.K.) was coated thereon.

A printing test was conducted as generally described in Example 5 and more than 200,000 sheets of print have no spoil and thin portion.

Example 17

To the ingredients of Example 16 was added 2.1 g of a microgel solution of Preparation Example 1 of U.S. application Ser. No. 07/843,951, and a printing plate was prepared as generally described in Example 16. A printing test of Example 16 was conducted, and better results then Example 16 were obtained.

TABLE 2

| Example number | 1 | 2 | 3 | 4 | 5 | 6 | 7 | 8 | 9 |
| --- | --- | --- | --- | --- | --- | --- | --- | --- | --- |
| Exposure time (min)[1] | 2 | 2 | 2 | 2 | 2 | 2 | 2 | 2 | 2 |
| Solid-clear step number[2] | 3-10 | 4-12 | 4-11 | 4-12 | 5-11 | 4-12 | 4-11 | 5-13 | 4-12 |
| Resolution of plate[3] | | | | | | | | | |
| Dot (%) | 0.5-98 | 0.5-97 | 0.5-98 | 0.5-97 | 0.5-98 | 0.5-97 | 0.5-98 | 0.5-97 | 0.5-98 |
| Remaining fine lines (μ) | 4 | 4 | 4 | 4 | 4 | 4 | 4 | 4 | 4 |
| Reverse lines (μ) | 15 | 15 | 15 | 15 | 15 | 15 | 12 | 15 | 15 |
| Print durability of printing plate[4] | Good | Excellent | Good | Good | Good | Good | Good | Excellent | Excellent |

| Example number | 10 | 11 | 12 | 13 | 14 | 15 | 16 | 17 |
| --- | --- | --- | --- | --- | --- | --- | --- | --- |
| Exposure time (min)[1] | 2 | 2 | 2 | 2 | 2 | 2 | 2 | 2 |
| Solid-clear step number[2] | 5-11 | 4-11 | 4-11 | 4-11 | 4-11 | 5-12 | 6-14 | 6-14 |
| Resolution of plate[3] | | | | | | | | |
| Dot (%) | 0.5-98 | 0.5-98 | 0.5-98 | 0.5-98 | 0.5-98 | 0.5-97 | 0.5-97 | 0.5-97 |
| Remaining fine lines (μ) | 4 | 4 | 4 | 4 | 4 | 4 | 4 | 4 |
| Reverse lines (μ) | 15 | 15 | 15 | 15 | 15 | 15 | 15 | 15 |
| Print durability of printing plate[4] | Excellent | Excellent | Excellent | Excellent | Excellent | Good | Excellent | Excellent |

| Comparative Example No. | 1 | 2 | 3 | 4 | 5 |
| --- | --- | --- | --- | --- | --- |
| Exposure time (min)[1] | 10 | 2 | 5 | 2 | 2 |
| Solid-clear step number[2] | 1-10 | 3-12 | 2-11 | — | 2-12 |
| Resolution of plate[3] | | | | | |
| Dot (%) | 5-98 | 0.5-98 | 3-98 | — | 0.5-97 |
| Remaining fine lines (μ) | 10 | 4 | 8 | — | 4 |
| Reverse lines (μ) | 10 | 15 | 12 | — | 15 |
| Print durability of printing plate[4] | Poor | Fairly good | Poor | Poor | Fairly good |

In Table 2, (—) shows that the layer thickness reduced and it is impossible to measure.

1) Exposed at a distance of 1.2 m, using a Vacuum Printer HVP-22H available from Sakaguchi Seiwa Kogyo K. K. (Metal Halide Lamp of 3 KW available from Eyegraphics K. K.).

2) Solid and clear step number were determined by a Step Wedge available from Fuji Photo Film Co., Ltd.

3) Determined by an Offset Examining Kaile 1982 available from UGRA Company.

4) The surface of the printing plate was immersed in a 20% aqueous colloidal silica (pH 8.5 to 9.0; available from Nissan Chemical Industries Ltd. as Snowtechs), and contacted with a rubber roller, using the apparatus of FIG. 1. The rubber roller and metal roller were rotated 10,000 times at a speed ratio of 3/2 (rubber / metal), and then degree of wear was determined by the eye.

Excellent: No wear was seen in the printing portion.
Good: Slightly wear was seen in the printing portion.
Fairly good: A little wear was seen in the printing portion.
Poor: Much wear was seen in the printing portion.

What is claimed is:

1. An alkali developable photosensitive resin composition comprising a mixture of an alkali-swellable or alkali-soluble binder resin and an oil-soluble diazo resin, wherein said binder resin has an acid value of 5 to 150 and has in its molecules a group represented by

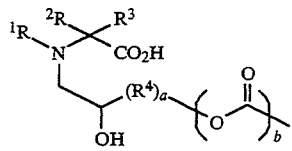

[1]

wherein $R^1$ represents a phenyl group which may have a substitution, $R^2$ and $R^3$, the same or different, represents a hydrogen atom or an alkyl group having 1 to 4 carbon atoms, $R^4$ represents an alkylene group of which a backbone may be interrupted with an oxygen atom, a cycloalkylene group or a combination thereof, and may have thereon an alkyl group, a hydroxyl group, an oxo (=O) group or a combination thereof, and a and b independently shows 0 or 1, wherein said oil soluble diazo resin is contained in the composition in an amount of 2 to 20 parts by weight, based on 100 parts by weight of the binder resin.

2. The alkali developable photosensitive resin composition according to claim 1 wherein said binder resin is prepared by copolymerizing a monomer (m1) represented by

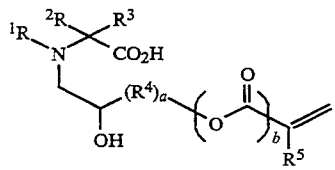

(m1)

wherein said $R^5$ represents a hydrogen atom or a methyl group, and $R^1$ to $R^4$, a and b are the same as mentioned above, with a copolymerizable monomer (m2) other than the monomer (m1).

3. The alkali developable photosensitive resin composition according to claim 1 wherein said copolymerizable monomer (m2) is selected from the group consisting of acrylic acid, methacrylic acid, crotonic acid, itaconic acid, maleic acid, fumaric acid, 2-hydroxyethyl (meth)acrylate, hydroxypropyl (meth)acrylate, hydroxybutyl (meth)acrylate, allyl alcohol, methallyl alcohol, a compound obtained by attaching an ethylenic unsaturated double bond to glycoside (e.g. glycosylethyl (meth)acrylate), dimethylaminoethyl (meth)acrylate, (meth)acrylamide, N-methylol acrylamide, diacetone acrylamide, (meth)acrylonitrile, methyl (meth)acrylate, ethyl (meth)acrylate, n-butyl (meth)acrylate, isobutyl (meth)acrylate, isopropyl (meth)acrylate, 2-ethylhexyl (meth)acrylate, (meth)acryl isocyanate, isocyanatoethyl (meth)acrylate, glycidyl (meth)acrylate, styrene, α-methylstyrene, vinyltoluene, t-butylstyrene, ethylene, propylene, vinyl acetate, vinyl propionate, butadiene and isoprene.

4. The alkali developable photosensitive resin composition according to claim 1 wherein an amount of the monomer (m1) is within the range of 1 to 300 parts by weight, based on 100 parts by weight of the monomer (m2).

5. The alkali developable photosensitive resin composition according to claim 1 wherein said binder is prepared by polymerizing a monomer (m 3) represented by

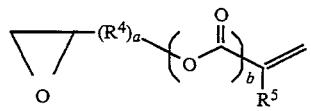

(m3)

wherein $R^4$, $R^5$, a and b are the same as mentioned above, with the monomer (m2) to obtain a polymer which is then reacted with a salt of N-aryl-α-amino acid, represented by

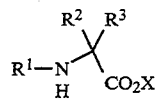

wherein X is a monovalent metal (e.g. Na and K), $R^1$, $R^2$ and $R^3$ are the same as mentioned above, then acidified.

6. The alkali developable photosensitive resin composition according to claim 1, further comprising a compound having an ethylenic unsaturated double bond.

7. The alkali developable photosensitive resin composition according to claim 1, further comprising a photopolymerization initiator.

8. The alkali developable photosensitive resin composition according to claim 1, comprising a sensitizing dye.

9. The alkali developable photosensitive resin composition according to claim 6 wherein said compound having an ethylenic unsaturated double bond is selected from the group consisting of styrene, vinyl toluene, chlorostyrene, t-butylstyrene, α-methylstyrene, divinyl benzene, (meth)acrylic acid, methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, t-butyl (meth)acrylate, 2-ethylhexyl (meth)acrylate, n-nonyl (meth)acrylate, n-decyl (meth)acrylate, lauryl (meth)acrylate, n-tridecyl (meth)acrylate, stearyl (meth)acrylate, ethyleneglycol mono(meth)acrylate, propyleneglycol mono(meth)acrylate, diethyleneglycol mono(meth)acrylate, dipropyleneglycol mono(meth)acrylate, polyethyleneglycol (molecular weight=200 to 1,000) mono(meth)acrylate, polypropyleneglycol (molecular weight=200 to 1,000) mono(meth)acrylate, polyethyleneglycol (molecular weight=200 to 1,000) monomethyl ether mono(meth)acrylate, polypropyleneglycol (molecular weight=200 to 1,000) monomethyl ether mono(meth)acrylate, polyethyleneglycol (molecular weight=200 to 1,000) monoethyl ether mono(meth)acrylate, polypropyleneglycol (molecular weight =200 to 1,000) monoethyl ether mono(meth)acrylate, n-butoxyethyl (meth)acrylate, phenoxyethyl (meth)acrylate, 2-phenoxypropyl (meth)acrylate, cyclohexyl (meth)acrylate, tetrafurfuryl (meth)acrylate, glycidyl (meth)acrylate, allyl (meth)acrylate, benzyl (meth)acrylate, tribromophenyl (meth)acrylate, 2,3-dichloropropyl (meth)acrylate, 3-chloro-2-hydroxypropyl (meth)acrylate, N,N-diethylaminoethyl (meth)acrylate, N,N-dimethylamino (meth)acrylate, N-t-butylaminoethyl (meth)acrylate, acrylamide, N,N-dimethyl acrylamide, N,N-diethyl acrylamide, ethyleneglycol di(meth)acrylate, propyleneglycol di(meth)acrylate,1,3-propanediol di(meth)acrylate, 1,4-butanediol di(meth)acrylate, neopentylglycol di(meth)acrylate, 1,6-hexanediol di(meth)acrylate, polyethyleneglycol di(meth)acrylate, polypropyleneglycol di(meth)acrylate, glycerol di(meth)acrylate, glycerol tri(meth)acrylate, trimethylolpropane tri(meth)acrylate, trimethylolethane tri(meth)acrylate, ethylene bisacrylamide, diallyl phthalate, triallyl cyanulate, diethyl fumarate, dibutyl fumarate, and vinyl acetate.

10. The alkali developable photosensitive resin composition according to claim 7 wherein said photopolymerization initiator is selected from the group consisting of benzoin, a benzoin alkyl ether, benzophenone, benzyl, benzyl dimethyl ketal, an anthraquinone derivative, an acridine derivative, a thioxanthone derivative, a triazine derivative and a titanocene derivative.

11. The alkali developable photosensitive resin composition according to claim 8 wherein said sensitizing dye is selected from the group consisting of a coumarin dye, a xanthene or thioxanthene dye, a cyanine dye and a merocyanine dye.

* * * * *

UNITED STATES PATENT AND TRADEMARK OFFICE
CERTIFICATE OF CORRECTION

PATENT NO. : 5,397,675
DATED : March 14, 1995
INVENTOR(S) : Seiji ARIMATSU et al.

It is certified that error appears in the above-indentified patent and that said Letters Patent is hereby corrected as shown below:

Title page item [75] Inventor : delete "Seuji" and insert "Seiji".

Signed and Sealed this

Third Day of September, 1996

Attest:

BRUCE LEHMAN

Attesting Officer

Commissioner of Patents and Trademarks